United States Patent
Dutta et al.

(10) Patent No.: US 11,250,913 B2
(45) Date of Patent: Feb. 15, 2022

(54) SCRAMBLING USING DIFFERENT SCRAMBLING SEEDS FOR DEFECT REDUCTION AND IMPROVED PROGRAMMING EFFICIENCY

(71) Applicant: WESTERN DIGITAL TECHNOLOGIES, INC., San Jose, CA (US)

(72) Inventors: Sudipta Dutta, Karnataka (IN); Amiya Banerjee, Karnataka (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/880,845

(22) Filed: May 21, 2020

(65) Prior Publication Data

US 2021/0366549 A1 Nov. 25, 2021

(51) Int. Cl.
| | | |
|---|---|---|
| *G11C 16/10* | (2006.01) | |
| *G11C 16/08* | (2006.01) | |
| *G06F 3/06* | (2006.01) | |
| *G11C 11/56* | (2006.01) | |
| *G11C 16/04* | (2006.01) | |

(52) U.S. Cl.
CPC ............ *G11C 16/10* (2013.01); *G06F 3/0604* (2013.01); *G06F 3/0659* (2013.01); *G06F 3/0679* (2013.01); *G11C 16/08* (2013.01); *G11C 11/5671* (2013.01); *G11C 16/0483* (2013.01)

(58) Field of Classification Search
CPC ..................................................... G11C 16/10
See application file for complete search history.

(56) References Cited

U.S. PATENT DOCUMENTS

| | | |
|---|---|---|
| 7,873,803 B2 | 1/2011 | Cheng |
| 8,666,068 B2 | 3/2014 | Sharon et al. |
| 8,793,556 B1 | 7/2014 | Northcott et al. |
| 8,874,994 B2 | 10/2014 | Sharon et al. |
| RE45,515 E | 5/2015 | Wan et al. |
| 2010/0070681 A1* | 3/2010 | Wan .................. G06F 12/0246 711/103 |
| 2012/0166714 A1* | 6/2012 | Mun .................. G06F 12/0246 711/103 |
| 2017/0277588 A1* | 9/2017 | Kim .................... G11C 16/10 |
| 2019/0179543 A1 | 6/2019 | Sharon et al. |
| 2020/0201546 A1* | 6/2020 | Yang .................... G06F 3/0655 |

* cited by examiner

*Primary Examiner* — Douglas King
(74) *Attorney, Agent, or Firm* — Arent Fox LLP

(57) ABSTRACT

Aspects of a storage device including a memory and a controller are provided which allow for efficient programming of cells on word lines using different scrambling seeds. The controller attempts to program cells of the memory by applying data scrambled using a first scrambling seed to the word line. If this attempt to program fails, the controller scrambles the data using a second, different scrambling seed and attempts to program the cells by applying the re-scrambled data to the word line. If this re-attempt also fails, the word line is listed. Then when the controller receives other data, the controller performs a final programming attempt with the other data scrambled using the second scrambling seed. If this further attempt fails, the controller identifies the block including the failed word line as a GBB. Thus, fewer GBBs may be incorrectly identified, reducing DPPM and improving memory yield of the storage device.

19 Claims, 8 Drawing Sheets

SCRAMBLING USING DIFFERENT SCRAMBLING SEEDS FOR DEFECT REDUCTION AND IMPROVED PROGRAMMING EFFICIENCY

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When reading or writing data in the flash memory, the flash storage device may identify the physical address of the block associated with the logical address in which the data is stored. The flash storage device may then read or write the data in the block at the identified physical address. The flash storage device may also erase data in the block prior to writing new data in the block. However, if there is a physical defect or other problem with the block during a read, program, or erase operation, a read failure, a program failure, or an erase failure may respectively occur. When such failure(s) occur, the flash storage device may mark the block as a grown bad block (GBB), and may logically or virtually remove the block from the population of accessible blocks. As a result, previous data writes to the GBB may need to be re-written to a new block, increasing the write amplification factor (WAF) of the flash storage device and degrading the storage device's endurance, storage efficiency, and performance.

SUMMARY

One aspect of a storage device is disclosed herein. The storage device includes a memory and a controller. The memory includes a plurality of memory cells coupled to a word line. The controller is configured to receive data from a host device, to scramble the data using a first scrambling seed, and to attempt to program the plurality of memory cells by applying the data scrambled using the first scrambling seed to the word line. When the attempt to program the plurality of memory cells using the first scrambling seed fails, the controller is further configured to scramble the data using a second scrambling seed that is different than the first scrambling seed, and to attempt to program the plurality of memory cells by applying the data scrambled using the second scrambling seed to the word line.

Another aspect of a storage device is disclosed herein. The storage device includes a memory and a controller. The memory includes a plurality of memory cells coupled to a word line. The controller is configured to receive data from a host device, and to attempt to program the plurality of memory cells by applying the data scrambled using a first scrambling seed to the word line. The controller is further configured to receive other data from the host device, and, when the attempt to program the plurality of memory cells using the first scrambling seed fails, to attempt to program the plurality of memory cells after the plurality of memory cells are erased by applying the other data scrambled using a second scrambling seed different than the first scrambling seed to the word line.

A further aspect of a storage device is disclosed herein. The storage device includes a memory and a controller. The memory comprises a block including a plurality of memory cells coupled to a word line. The controller is configured to attempt to program the plurality of memory cells by applying data scrambled using a first scrambling seed to the word line. The controller is further configured to receive other data from a host device, and when the attempt to program the plurality of memory cells using the first scrambling seed fails, to attempt to program the plurality of memory cells by applying the other data scrambled using a second scrambling seed different than the first scrambling seed to the word line. The controller is further configured to identify the block as a bad block when the attempt to program the plurality of memory cells with the other data using the second scrambling seed fails.

It is understood that other aspects of the storage device and method will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
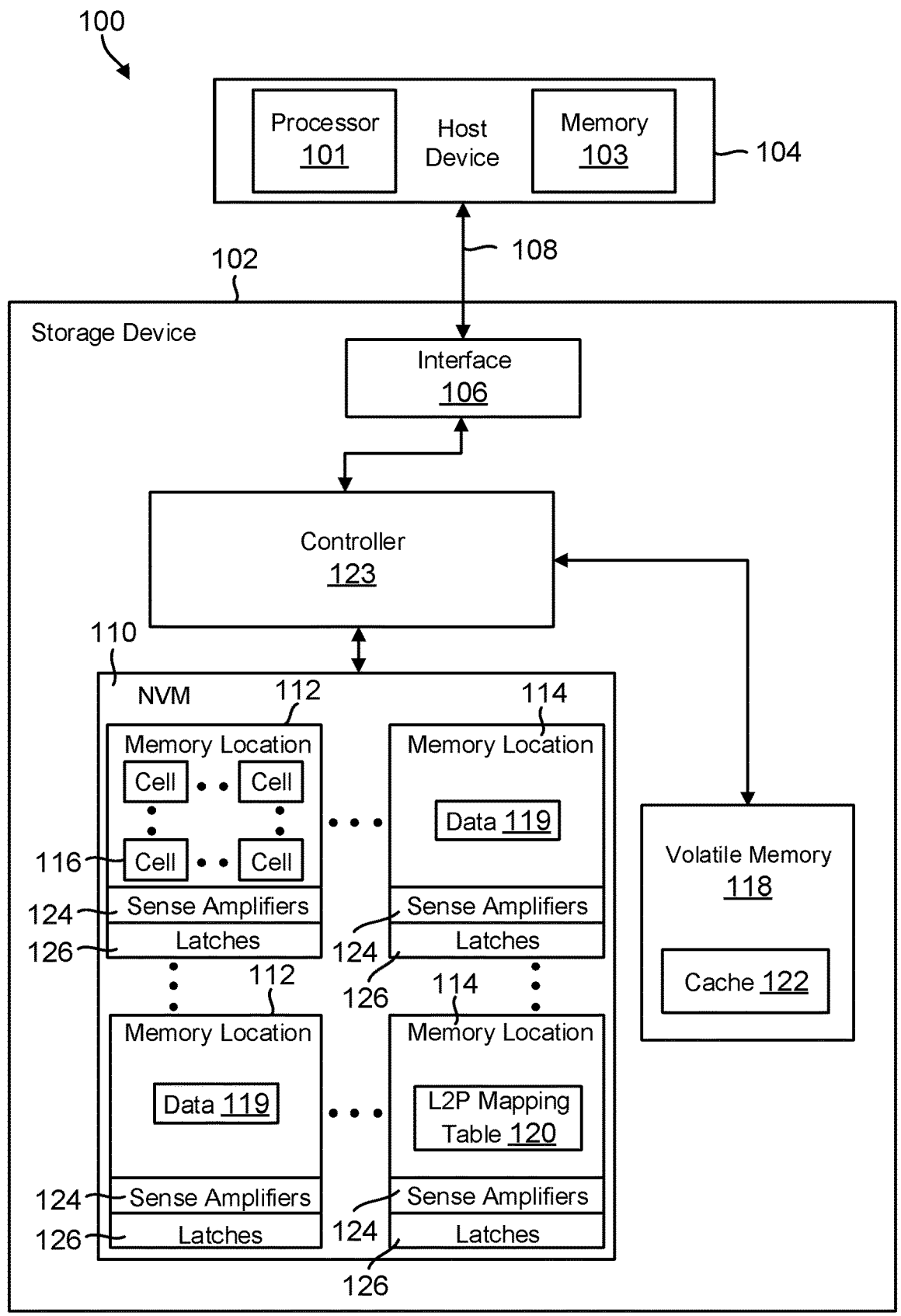
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

When a controller of the storage device writes data into memory, the controller generally scrambles the data using a scrambling seed, and then attempts to program the scrambled data into various memory cells on a word line. The controller may attempt to program the data by applying a voltage to the word line over a given number of incremental-step-pulse programming (ISPP) cycles until electrons tunnel into charge trapping layers of selected memory cells. However, in some cases, the cells on the word line may not be successfully programmed within a predetermined time or loop count (e.g. a maximum number of ISPP cycles). For example, program failure may occur due to a physical defect in the memory (e.g. a short between word lines, a short between a word line and a memory hole that includes the memory cells, or a short between a word line and a channel of the cell), due to degradation of NAND (e.g. as a result of many program/erase cycles (P/E cycles) over time), or due to process variations between the transistors in the memory cells (e.g. differences in oxide thickness, channel length, doping concentration, and other factors). When a program failure occurs, the controller may identify the block including the word line as a GBB and discard that block from the population of blocks available for access in the storage device. As a result, the WAF of the storage device may increase. When such problem occurs in multiple word lines and blocks, the defective parts per million (DPPM) of the storage device may exceed acceptable DPPM target levels.

However, in some cases, the program failure of cells on a word line may not be due to physical memory defects (e.g. there is no charge leakage due to shorts) or NAND degradation (e.g. there is no abnormal voltage threshold distributions of the cells). For example, some memory cells may require additional ISPP cycles than others to be successfully programmed due to process variations, and thus program failure may occur for these cells if their required programming time exceeds the predetermined time or loop count. To address these cases, the storage device described in the present disclosure may change the scrambling seed used to scramble the data in attempt to successfully program the cells on the word line. By using a different scrambling seed, different memory cells on the word line may be selected for programming the scrambled data, thus increasing the likelihood that program failure may not recur. As a result, the number of GBBs which are identified may be reduced, reducing the DPPM of the storage device and improving programming efficiency through reduced WAF.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
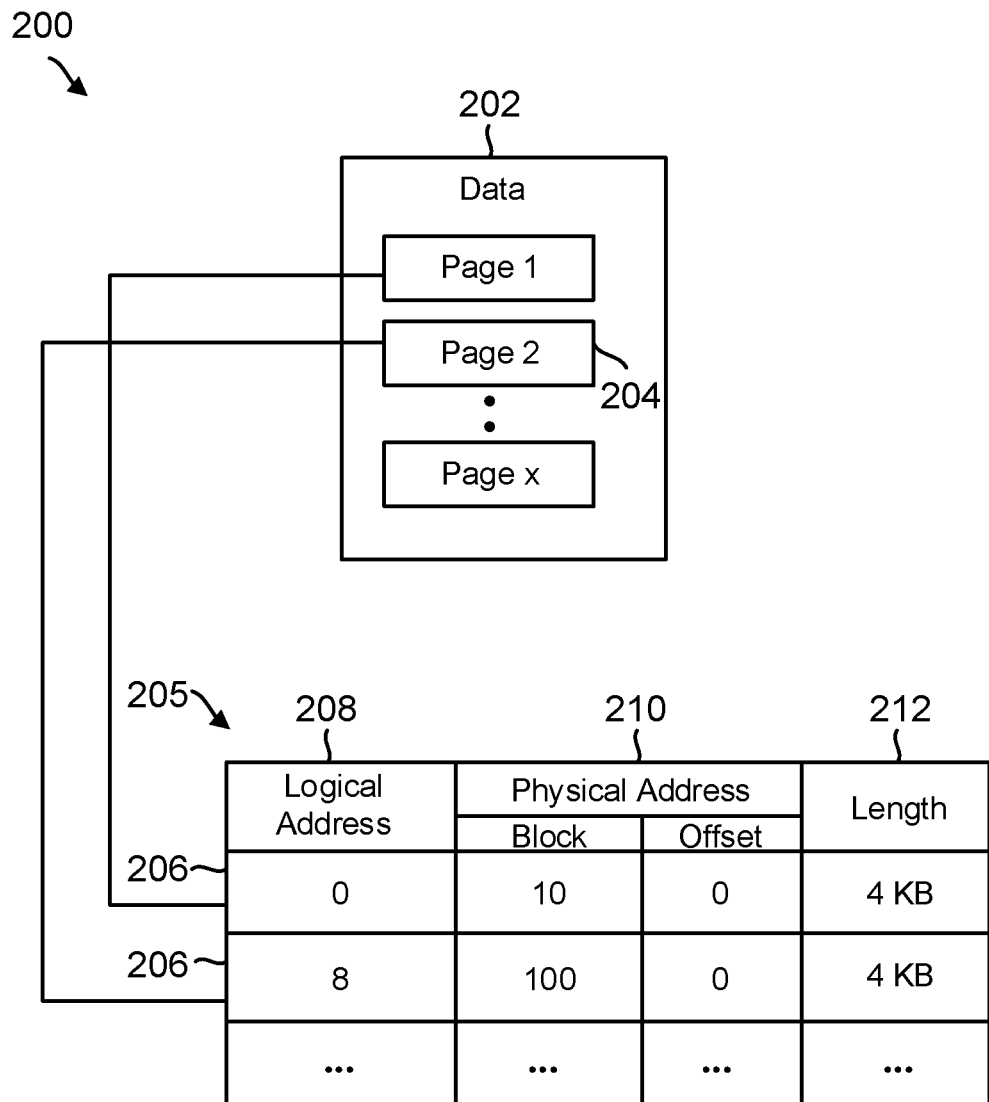
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
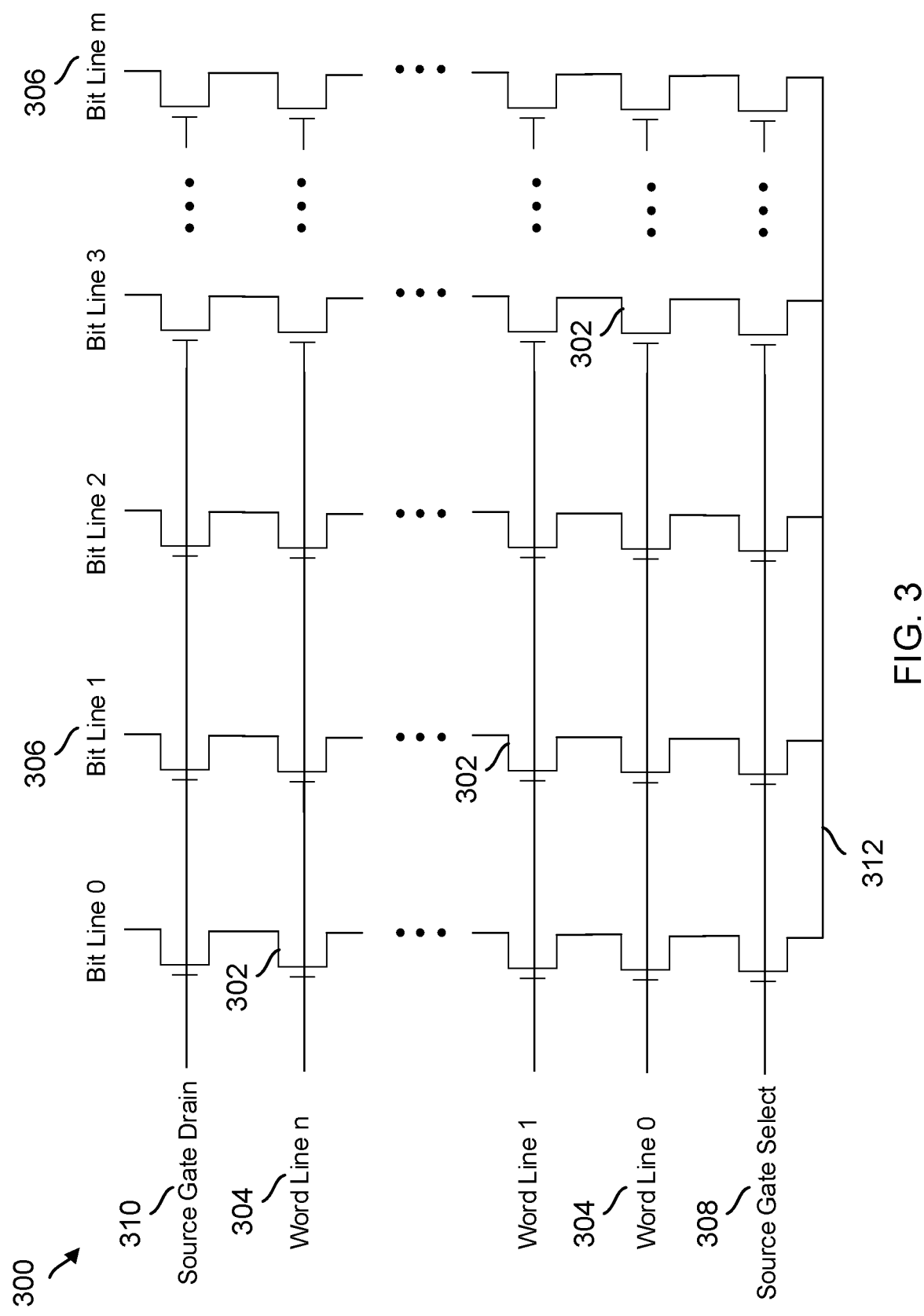
FIG. 3 is a conceptual diagram illustrating an example of a two dimensional array of memory cells in the storage device of FIG. 1.

FIG. 3 illustrates an example of a two-dimensional (2D) NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines spanning across multiple blocks 114 of the NVM 110, where n and m are predefined according to the size of the memory array 300. Source gate select (SGS) cells 308 and source gate drain (SGD) cells 310 are coupled to the memory cells 302 on each bit line 306. The SGS cells 308 and SGD cells 310 connect the memory cells 302 to a source line 312 (e.g. ground) and bit lines 306, respectively.

Figure 4:
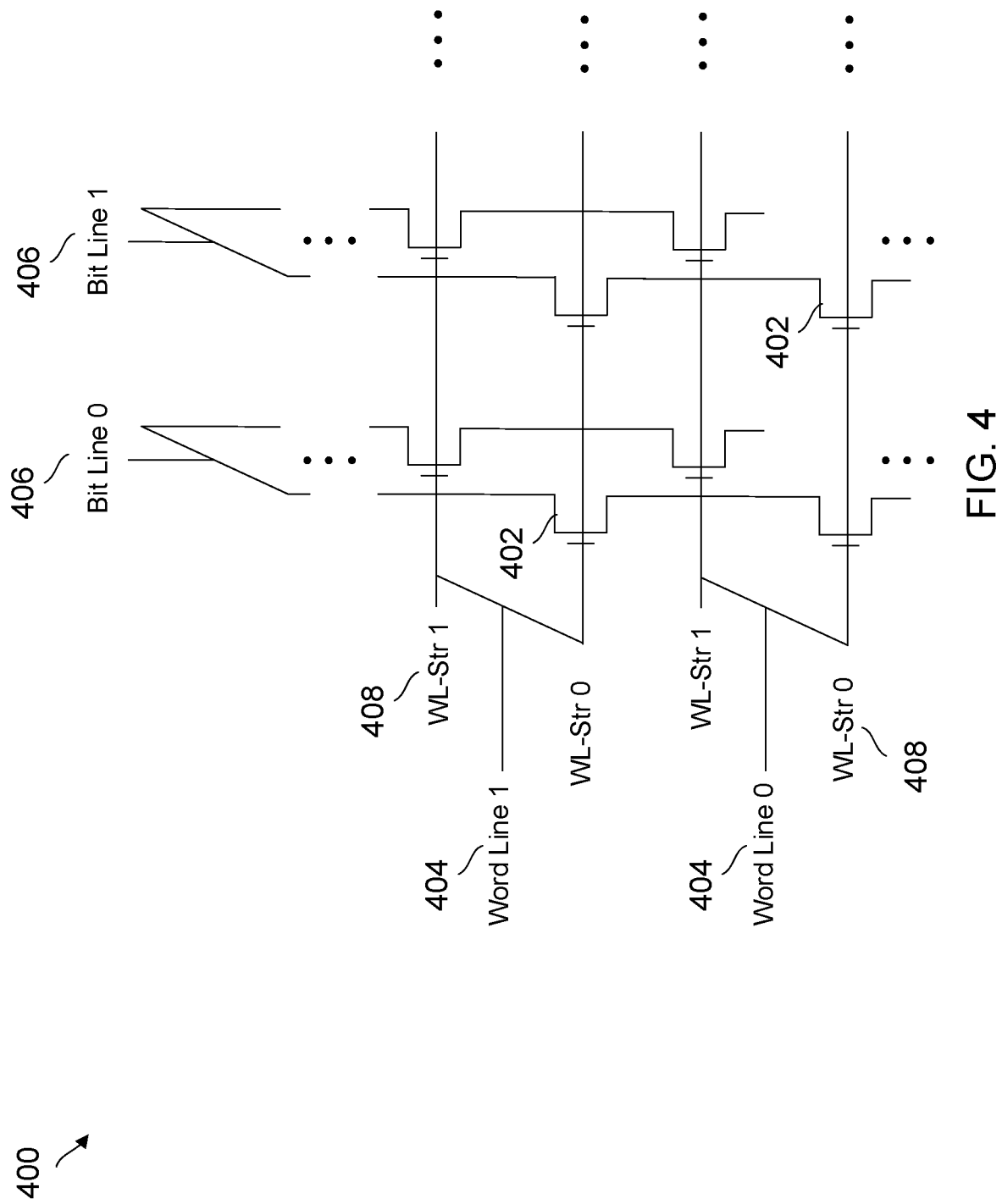
FIG. 4 is a conceptual diagram illustrating an example of a three dimensional array of memory cells in the storage device of FIG. 1.

FIG. 4 illustrates an example of a three-dimensional (3D) NAND memory array 400 of cells 402. Cells 402 may correspond to cells 116 in the NVM 110 of FIG. 1. As in the 2D memory array 300 of FIG. 3, multiple cells 402 may be coupled to word lines 404 and bit lines 406. However, in the 3D memory array 400, the word lines 404 may each include multiple word line strings 408, and the bit lines 406 may be connected to each of the word line strings 408. Similarly, SGS cells and SGD cells (not shown) may respectively connect the memory cells in each word line string 408 to the source line (not shown) and bit lines 406. Thus, 3D memory array 400 may store more individually accessible pages of data on each word line 404 (e.g. in word line strings 408) than 2D memory array 300. While the 3D memory array 400 illustrated in FIG. 4 includes an example of two word line strings 408 for each word line 404, the word lines 404 may include other numbers of word line strings (e.g. four WL-Strs 0-3) in other examples.

When the controller 123 reads data from or writes data to a page of cells 302, 402 (i.e. on a word line 304, 404 or word line string 408), the controller may apply a read voltage or program voltage to the selected word line and a pass through voltage to the other word lines. The read or programmed state of the cell (e.g. a logic '0' or a logic '1' for SLCs) may then be determined based on a threshold voltage of the cells 302, 402. For example, during an SLC read operation, if the threshold voltage of a cell 302, 402 is smaller than the read voltage (i.e. current flows through the cell in response to the read voltage), the controller 123 may determine that the cell stores a logic '1', while if the threshold voltage of the cell 302, 402 is larger than the read voltage (i.e. current does not flow through the cell in response the read voltage), the controller 123 may determine that the cell stores a logic '0'. Similarly, during an SLC program operation, the controller may store a logic '0' by applying the program voltage to the cell 302, 402 on the word line 304, 404 until the cell reaches the threshold voltage, and during an erase operation, the controller may apply an erase voltage to the block including the cells 302, 402 until the cells reduce back below the threshold voltage (back to logic '1').

Figure 5:
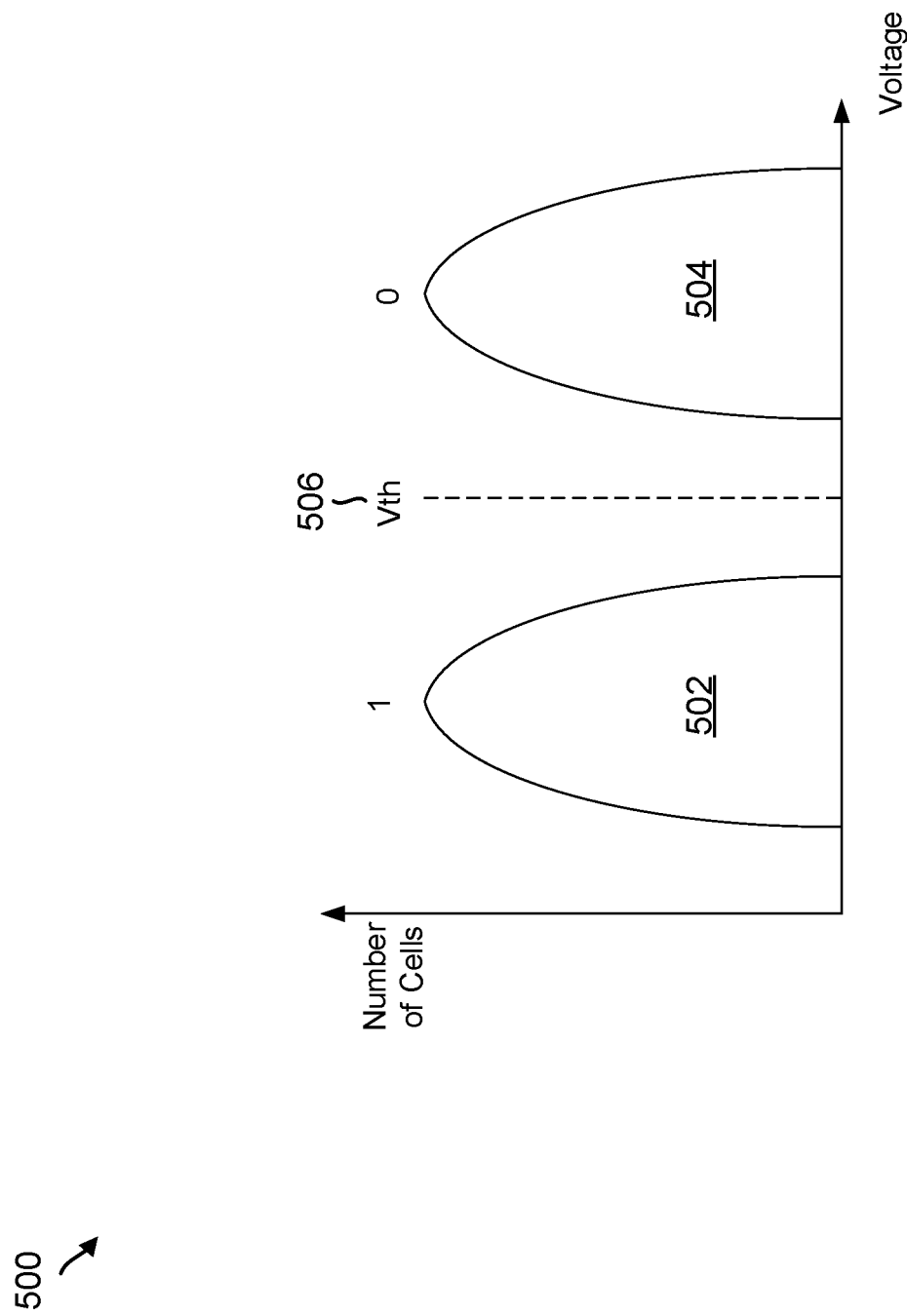
FIG. 5 is a graphical diagram illustrating an example of a voltage distribution chart for single-level cells in the storage device of FIG. 1.

FIG. 5 illustrates an example of a voltage distribution chart 500 illustrating different NAND states for SLCs (e.g. cells 116, 302, 402) storing one bit of data (e.g. a logic 0 or 1). The SLCs may be in an erase state 502 corresponding to logic '1', or a program state 504 corresponding to logic '0'. Initially, the cells 116, 302, 402 may be in the erase state 502, e.g. after the controller 123 erases a block 114 including the cells. While FIG. 5 illustrates two NAND states for SLCs (e.g. logic 0 and logic 1), the number of states may be different depending on the amount of data that is stored in each cell 116, 302, 402. For example, MLCs may have four states (e.g. logic 00, 01, 10, 11), TLCs may have eight states, and QLCs may have sixteen states.

When the controller 123 attempts to program cells of a selected word line or word line string into a program state 504, the controller generally performs ISPP over a number of programming loops or ISPP cycles. For example, the controller may apply a programming voltage (e.g. a high voltage) to the selected word line 304, 404 or word line string 408, a pass through voltage (e.g. a high voltage lower than the programming voltage) to the other word lines 304, 404, a bit line program voltage (e.g. a low voltage) on the bit lines connected to the selected cells being programmed on the selected word line, and a bit line inhibit voltage (e.g. a high voltage) on the bit lines connected to the other cells not being programmed on the selected word line. Applying a high programming voltage to the selected word line allows electrons to tunnel from the channel into the charge trapping layer of those cells, thereby causing the threshold voltage of the cells to increase. After the programming voltage is applied, the controller applies a program verify voltage (e.g. a low voltage) to the word line 304, 404 or word line string 408 to determine whether the threshold voltage of the cells exceeds a threshold voltage 506 corresponding to the program state 504. If the threshold voltage of the cells does not exceed the threshold voltage 506, the controller may determine that the cells 302, 402 are still in the erase state 502. Accordingly, in the next programming loop or ISPP cycle, the controller may apply a higher programming voltage to further increase the threshold voltage of the cells, and then again may apply a program verify voltage to determine whether the new threshold voltage exceeds the threshold voltage 506. The controller may similarly repeat the above process of incrementally increasing the programming voltage and verifying the voltage threshold of the selected cells over a number of programming loops. If the threshold voltage of the cells exceeds the threshold voltage 506 and the total number of programming loops does not exceed a predetermined loop count, the controller may determine that the cells have entered the program state 504 and are thus successfully programmed.

However, in some cases, the cells 116, 302, 402 may not successfully reach the program state 504, resulting in program failure. In one example, a physical defect such as a short may exist in the NAND memory array 300, 400 causing charge leakage (e.g. a global control gate (CG) defect, leakage between a word line and another word line or a dummy word line, leakage between a word line and a memory hole, SGD leakage, SGS leakage, source select gate line (SGSB) leakage, and local block select line (Blk_select-LI) leakage). In another example, the threshold voltage distribution or voltage noise level of the cells in a word line may be abnormal (e.g. the threshold voltages of cells in the program state 504 may overlap with the threshold voltages of cells in the erase state 502). In a further example, process variations in the cells 302, 402 may prevent the threshold voltage of the cells from exceeding the threshold voltage 506 within the predetermined loop count (e.g. the maximum number of ISPP cycles). In such cases, when the controller performs ISPP to program the cells of a word line, one or more cells in the word line may not successfully transition into the program state 504 within the maximum number of ISPP cycles. As a result, the controller may determine that a program failure has occurred, and the controller may identify the memory location 112 or block 114 that included the failed word line as a GBB.

Figure 6A:
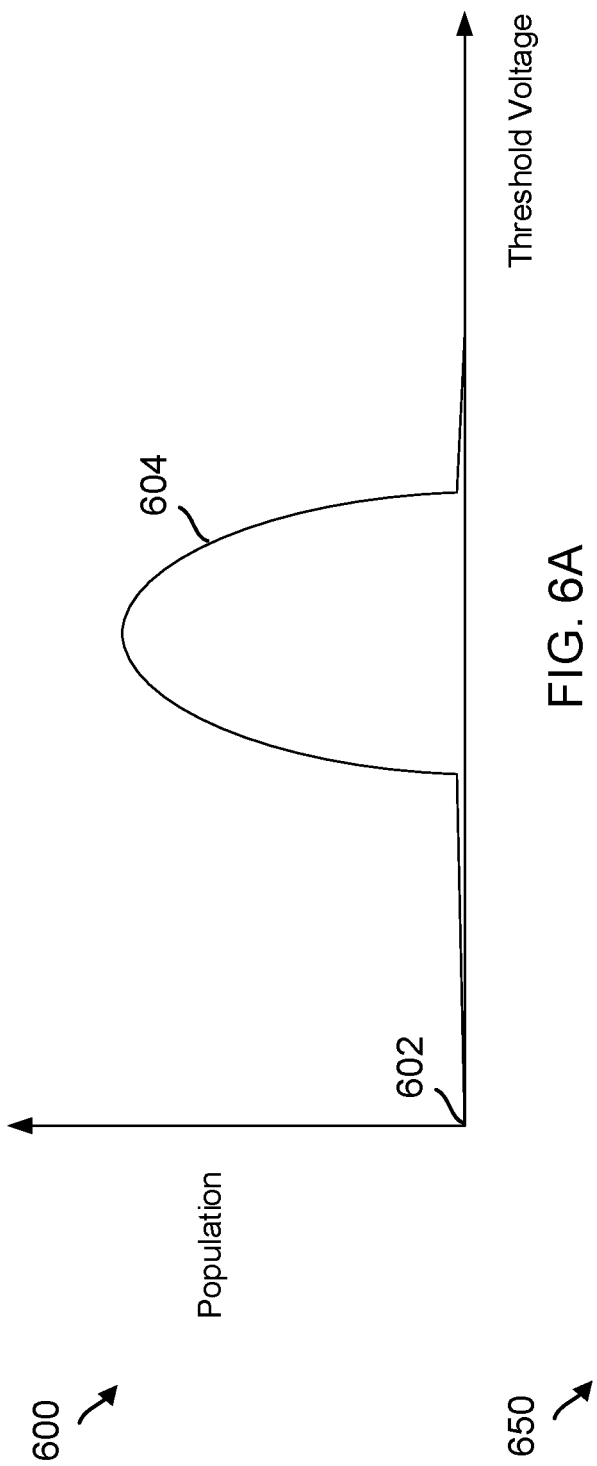
FIGS. 6A and 6B are graphical diagrams illustrating examples of threshold voltages and voltage noise levels of cells during a program failure in the storage device of FIG. 1.
Figure 6B:
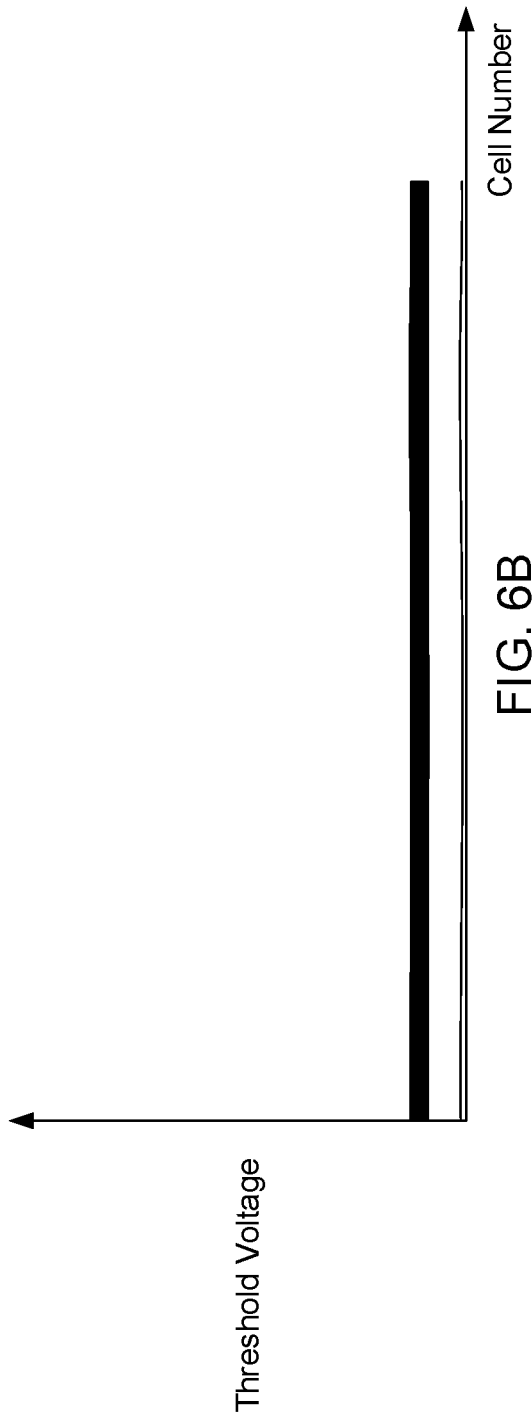

The storage device described in the present disclosure may mitigate such program failures by using a different scrambling seed when a physical defect such as a short or an abnormal voltage threshold distribution does not exist. For example, FIG. 6A illustrates an example diagram 600 of a voltage threshold distribution of cells in a word line (e.g. word line 304, 404 or word line string 408) in a block that experienced a program failure, and FIG. 6B illustrates an example diagram 650 of a voltage noise level distribution of the cells along the same word line. Assuming a charge leakage does not exist (e.g. which may be determined from testing), the voltage threshold distribution shown in the example of FIG. 6A is not abnormal (for example, the voltage thresholds of cells in the erase state 602, if any, and cells in the program state 604 are separate and do not overlap) and the noise level of the voltage thresholds shown in the example of FIG. 6B is minimal. Nevertheless, program failure may still occur due to process variations in the cells as described above. For instance, if some of the cells being programmed with scrambled data based on one scrambling seed are slow corners, then increasing the program loop threshold limit (e.g. from 3 loops to 5 loops or even 9 loops) may still not prevent program failure from occurring for these cells. However, by changing the scrambling seed, different cells (e.g. possibly faster corners) may be selected on the word line or word line string for programming, thus increasing the likelihood that the data may be successfully programmed.

Figure 7:
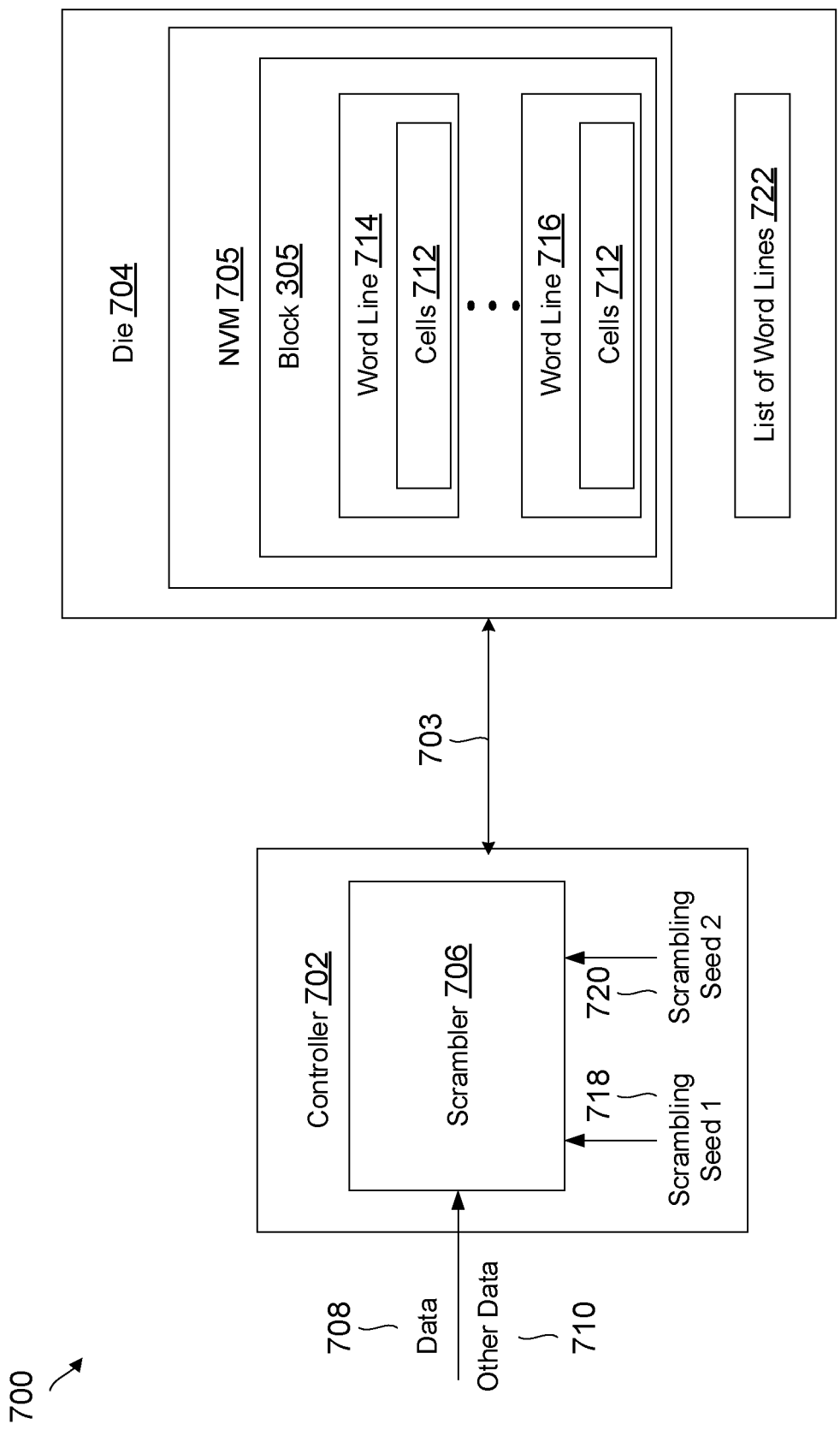
FIG. 7 is a conceptual diagram illustrating an example of a controller that scrambles data communicated to a die in the storage device of FIG. 1.

FIG. 7 illustrates an example diagram 700 of a controller 702 in communication with a die 704 over a bus 703. The controller 702 may correspond to controller 123 of FIG. 1, and the die 704 may include a NVM 705 corresponding to the NVM 110 of FIG. 1. The controller 702 may include a scrambler 706 which scrambles or encrypts data 708, 710 received from a host device (e.g. host device 104) before it is programmed into cells 712 (e.g. cells 116, 302, 402) of word lines 714, 716 (e.g. word line 304, 404 or word line string 408). The scrambler 706 may be implemented using the above-described one or more processors of the controller 123, 702.

When the controller 702 initially receives data 708 to be programmed (e.g. in the cells 712 of the word line 714), the scrambler 706 may identify a first scrambling seed 718. The scrambling seed 718 may be, for example, a random or pseudo-random number (e.g. a random or pseudo-random pattern generated and stored in a buffer in volatile memory 118 by a FILLBUFRAND function (or some other name) implemented using the above-described one or more processors of the controller). After identifying the first scrambling seed 718, the scrambler 706 may scramble the data 708 using the first scrambling seed 718. For example, the scrambler 706 may shift the seed or generated random/pseudo-random pattern a number of times (e.g. using a linear feedback shift register) based on a logical address associated with the data 708, and the scrambler 706 may apply an exclusive-or (XOR) operation by XOR'ing the data 708 with the shifted pattern. After scrambling the data, the controller 702 may attempt to program the scrambled data into the cells 712 of the word line 714 as described above (e.g. using ISPP).

If programming of the word line is successful, the cells 712 of the word line 714 (e.g. word line 304, 404 or word line string 408) may include an equal number of erase and program states depending on the amount of data stored in the cells. For instance, if the cells 712 are SLCs, then once the scrambled data is stored, half of the cells on the word line 714 may be in the erase state (e.g. store a logic 1) while the other half of the cells on the word line may be in the program state (e.g. store a logic 0). In other words, for SLCs, the scrambled data may include an equal number of 1's and 0's. Similarly, if the cells 712 are MLCs including four possible states, then once the scrambled data is stored, a first quarter of the cells of the word line may be in the erase state (logic 11), a second quarter of the cells of the word line may be in a first program state (logic 10), a third quarter of the cells may be in a second program state (logic 01), and a last quarter of the cells may be in a third program state (logic 00). Likewise, if the cells 712 are TLC or QLCs, etc., the word line 714 may be divided into equal numbers of different states (e.g. eighths or sixteenths, etc., respectively).

However, as described above, some of the cells 712 being written with the scrambled data may fail to program (e.g. fail to reach a logic '0' within the predetermined maximum number of ISPP cycles) due to process variations or other reasons, assuming no physical defects or abnormal voltage threshold distributions are detected. At this point, the word line 714 may be partially programmed (e.g. some of the cells may have successfully transitioned to a program state while others failed to transition out of the erase state). Accordingly, the controller may attempt to re-program the word line 714 based on a second scrambling seed 720 different than the first scrambling seed 718. The second scrambling seed 720 may be, for example, a random or pseudo-random number which is XOR'ed with the first scrambling seed 718 or another pattern and which result is shifted by a number of bits (e.g. a pattern generated and stored in a buffer of volatile memory 118 by a FILLBUF_XORShift function (or some other name) implemented using the above-described one or more processors of the controller). After identifying the second scrambling seed 720, the scrambler 706 may scramble the data 708 using the second scrambling seed 720 as described above. As a result, the re-scrambled data based on the second scrambling seed may include a different pattern of 1's and 0's than the initially scrambled data based on the first scrambling seed, and the controller 702 may attempt to program the re-scrambled data into the cells 712 of the word line 714 again as described above (e.g. using ISPP and with equal numbers of cells in different states).

Accordingly, different cells 712 may be programmed with the re-scrambled data based on the second scrambling seed 720 than based on the first scrambling seed 718, thus increasing the likelihood that the scrambled data will be successfully programed. For example, while the previous cells attempted to be programmed on the word line 714 based on the first scrambling seed may have failed to program within a threshold loop count (e.g. 5 loops), the current cells attempted to be programmed based on the second scrambling seed may have succeeded within the threshold loop count (e.g. in 2 loops). Thus, less GBBs may be identified, resulting in lower WAF and improved storage device performance. Moreover, the voltage distribution thresholds of the cells 712 after successful programming with the re-scrambled data may be similar to the voltage distribution thresholds of the cells 712 which failed to program with the previously scrambled data (e.g. as shown in FIG. 6A). After the cells on the word line 714 are successfully programmed, the controller 702 may continue programming other word lines 716 with the data 708 scrambled based on the first scrambling seed 718.

However, in some cases, even after scrambling with the second scrambling seed 720, the different cells on the word line 714 being written with the re-scrambled data may still fail to program (e.g. fail to reach a logic '0' within the predetermined maximum number of ISPP cycles), again due to process variations or other reasons. In such cases where the cells 712 of a particular word line 714 fail to program even after changing the scrambling seed, the controller 702 may add that word line to a list of word lines 722 stored in the memory of the die 704 (e.g. a volatile memory or the NVM 705). The controller may then skip that word line 714 and proceed to continue programming of the data 708 in the cells of other word lines 716 based on the first scrambling seed 718 as noted above.

When the controller later receives other data 710 to be programmed into a word line 714, 716 of the block (e.g. in response to another host command after the block becomes full, the stored data 708 is relocated, and the cells 712 in the block are erased), the controller may check the list of word lines 722 to determine if the selected word line is in the list. If the word line 716 is not in the list of word lines (i.e. it was successfully programmed), the controller may program the other data 710 in the word line 716 based on the first scrambling seed 718 as described above. On the other hand, if the word line 714 is in the list of word lines (i.e. it failed to previously program using both the first and second scrambling seeds), the controller may attempt to program the other data 710 in the word line initially based on the second scrambling seed 720 as described above, rather than based on the first scrambling seed 718. The controller may similarly attempt to program cells initially based on the second scrambling seed in all word lines determined from the list of word lines 722. However, if the attempt to program the other data 710 initially using the second scrambling seed 720 also fails in any of the identified word lines from the list of word lines 722, the controller may identify the block including the failed word line as a GBB. In this way, blocks including word lines that fail to successfully program using the first scrambling seed, but which successfully program using the second scrambling seed, may not be misidentified as GBBs. In contrast, blocks including word lines that failed to successfully program different host data even using the second scrambling seed may be correctly identified as GBBs. Thus, the DPPM of the storage device may be reduced and the memory yield of the storage device may be improved.

Figure 8:
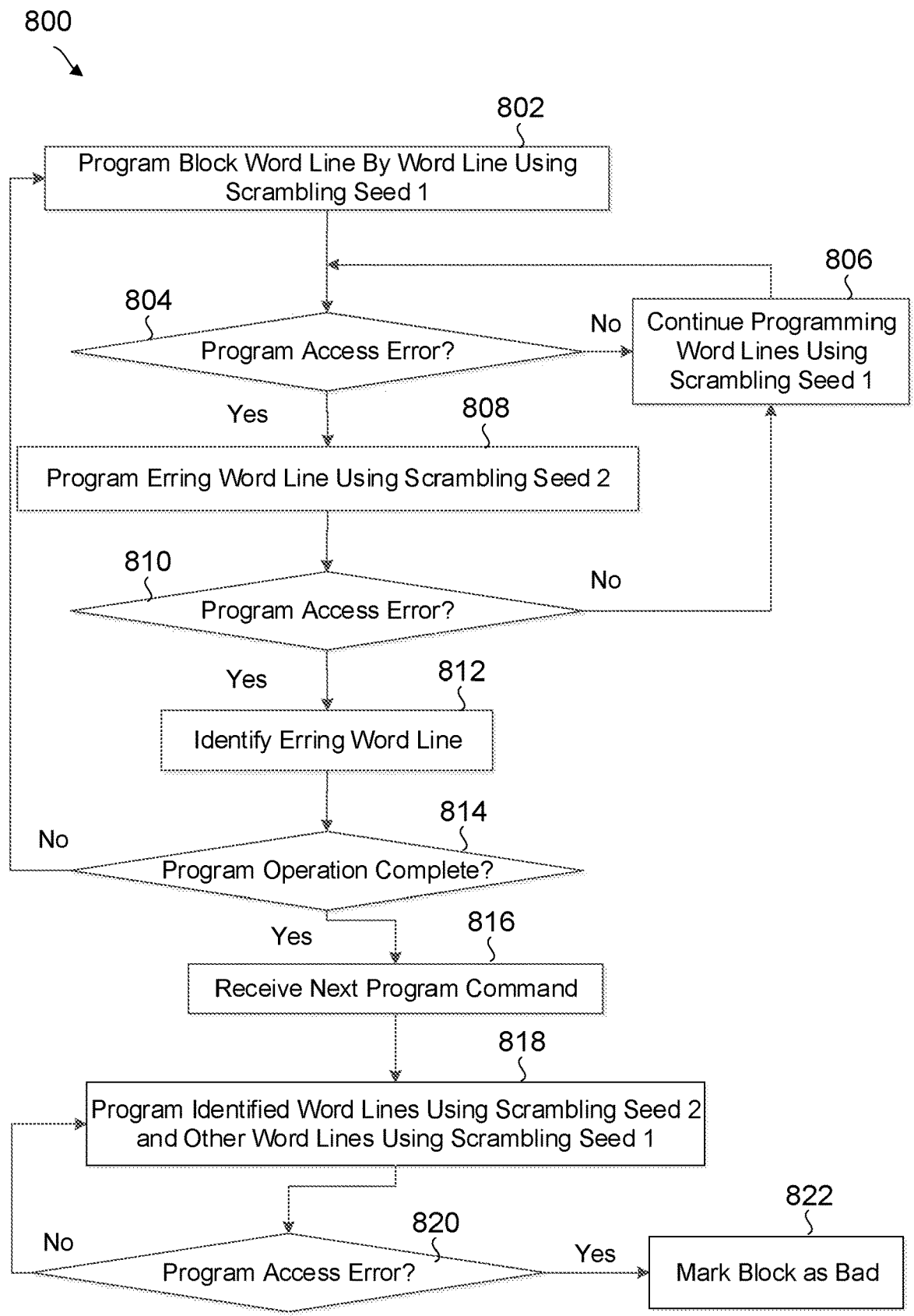
FIG. 8 is a flow chart illustrating a method for programming word lines using different scrambling seeds, which is performed by the storage device of FIG. 1.

FIG. 8 illustrates an example flow chart 800 of a method for programming word lines using different scrambling seeds. For example, the method can be carried out in a storage device 102 such as the one illustrated in FIG. 1. Each of the steps in the flow chart can be controlled using the controller as described below (e.g. controller 123, 702), or by some other suitable means.

As represented by block 802, the controller may attempt to program cells in a block word line by word line using a first scrambling seed. For instance, referring to FIGS. 1 and 7, the controller 123, 702 may receive data 708 from a host device 104, scramble the data 708 using a first scrambling seed 718, and attempt to program a plurality of memory cells 712 (of a memory such as NVM 110, 705) coupled to a word line 714 by applying the data 708 scrambled using the first scrambling seed 718 to the word line 714 (e.g. using ISPP as described above).

As represented by block 804, the controller may determine if a program access error (program failure) has occurred when attempting to program cells in a word line using the first scrambling seed. If a program failure did not occur, then as represented by block 806, the controller may continue to attempt to program cells in other word lines using the first scrambling seed. For instance, referring to FIGS. 1 and 7, if programming of the cells 712 in word line 714 is successful using the first scrambling seed 718, the controller 123, 702 may continue to program cells in other word lines 716 using the first scrambling seed 718 as described above (e.g. using ISPP).

Otherwise, if a program failure did occur, then as represented by block 808, the controller may attempt to program cells in the erring word line using a second scrambling seed. For instance, referring to FIGS. 1 and 7, when the attempt to program the plurality of memory cells 712 using the first scrambling seed 718 fails, the controller 123, 702 may scramble the data 708 using a second scrambling seed 720 that is different than the first scrambling seed 718, and attempt to program the plurality of memory cells 712 by applying the data 708 scrambled using the second scrambling seed 720 to the word line 714 (e.g. using ISPP).

As represented by block 810, the controller may determine if another program access error has occurred when attempting to program cells in the word line using the second scrambling seed. If a program failure did not occur, then as represented again by block 806, the controller may continue to attempt to program cells in other word lines using the first scrambling seed. For instance, referring to FIGS. 1 and 7, the memory (e.g. NVM 110, 705) may include additional memory cells (e.g. cells 116, 712) coupled to an additional word line (e.g. word line 716); and when the attempt to program the plurality of memory cells 712 in word line 714 using the second scrambling seed 720 succeeds, the controller 123, 702 may attempt to program the additional memory cells by applying the data 708 scrambled using the first scrambling seed 718 to the additional word line 716 (e.g. using ISPP).

Otherwise, if a program failure again occurred, then as represented by block 812, the controller may identify the erring word line. For instance, referring to FIGS. 1 and 7, when the attempt to program the plurality of memory cells 712 in the word line 714 using the second scrambling seed 720 fails, the controller 123, 702 may add the word line 714 to a list of word lines 722. The controller may then continue to attempt to program cells in other word lines similarly as described above until programming is complete, as represented by block 814. For instance, referring to FIGS. 1 and 7, the memory (e.g. NVM 110, 705) may include additional memory cells (e.g. cells 116, 712) coupled to an additional word line (e.g. word line 716); and the controller 123, 702 may attempt to program the additional memory cells 712 by applying the data 708 scrambled using the first scrambling seed 718 to the additional word line 716 after adding the word line 714 to the list of word lines 722 (e.g. using ISPP).

Afterwards, as represented by block 816, the controller may receive a next program command, in which case, as represented by block 818, the controller may attempt to program cells in identified word lines using the second scrambling seed and cells in other word lines using the first scrambling seed. For instance, referring to FIGS. 1 and 7, the controller 123, 702 may receive other data 710 from the host device 104, determine whether the word line 714 is in the list of word lines 722, and attempt to program the plurality of memory cells 712 by applying the other data 710 scrambled using the second scrambling seed 720 to the word line 714 when the word line is in the list of word lines 722 (e.g. using ISPP).

Then as represented by block 820, the controller may determine if another program access error has occurred when attempting to program cells in the word line again using the second scrambling seed. If a program failure did not occur, the controller may continue to attempt to program cells in the identified and other word lines using respective scrambling seeds as described above. For instance, referring to FIGS. 1 and 7, the memory (e.g. NVM 110, 705) may include additional memory cells 712 coupled to an additional word line 716, and the controller 123, 702 may receive other data 710 from the host device 104, determine whether the additional word line 716 is in the list of word lines 722, and attempt to program the additional memory cells 712 by applying the other data 710 scrambled using the first scrambling seed 718 to the additional word line 716 when the additional word line is not in the list of word lines 722 (e.g. using ISPP).

Otherwise, if a program failure again occurred, then as represented by block 822, the controller may mark the block including the erring word line as a bad block. For instance, referring to FIGS. 1 and 7, the memory (e.g. NVM 110, 705) may comprise a block 114 including the plurality of memory cells 116, 712 coupled to the word line 714; and the controller 123, 702 may identify the block 114 as a bad block when the attempt to program the plurality of memory cells 712 with the other data 710 using the second scrambling seed 720 fails (e.g. using ISPP).

Accordingly, the storage device described in the present disclosure allows for recovery of blocks which do not have physical defects such as shorts or damage to the NAND, but which include cells that fail to program using one scrambling seed as opposed to another scrambling seed. As a result, blocks including word lines that fail to successfully program using one scrambling seed but successfully program using another scrambling seed may not be misidentified as GBBs, while blocks including word lines that fail to successfully program host data even using the second scrambling seed may be correctly identified as GBBs. Thus, the DPPM of the storage device may be reduced and the memory yield of the storage device may be improved.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory including a plurality of memory cells coupled to a word line;
a controller configured to receive data from a host device, to scramble the data using a first scrambling seed, and to attempt to program the plurality of memory cells by applying the data scrambled using the first scrambling seed to the word line;
wherein, in response to the attempt to program the plurality of memory cells using the first scrambling seed failing, the controller is further configured to scramble the data using a second scrambling seed that is different than the first scrambling seed, and to attempt to program the plurality of memory cells by applying the data scrambled using the second scrambling seed to the word line;
wherein the memory includes additional memory cells coupled to an additional word line; and wherein in response to the attempt to program the plurality of memory cells using the second scrambling seed succeeding, the controller is further configured to attempt to program the additional memory cells by applying the data scrambled using the first scrambling seed to the additional word line.

2. The storage device of claim 1, wherein in response to the attempt to program the plurality of memory cells using the second scrambling seed failing, the controller is further configured to add the word line to a list of word lines.

3. The storage device of claim 2, wherein the memory includes additional memory cells coupled to an additional word line; and wherein the controller is further configured to attempt to program the additional memory cells by applying the data scrambled using the first scrambling seed to the additional word line after adding the word line to the list of word lines.

4. The storage device of claim 2, wherein the controller is further configured to receive other data from the host device, to determine whether the word line is in the list of word lines, and to attempt to program the plurality of memory cells by applying the other data scrambled using the second scrambling seed to the word line when the word line is in the list of word lines.

5. The storage device of claim 4, wherein the memory comprises a block including the plurality of memory cells coupled to the word line; and wherein the controller is further configured to identify the block as a bad block in response to the attempt to program the plurality of memory cells with the other data using the second scrambling seed failing.

6. The storage device of claim 2, wherein the memory includes additional memory cells coupled to an additional word line; and wherein the controller is further configured to receive other data from the host device, to determine whether the additional word line is in the list of word lines, and to attempt to program the additional memory cells by applying the other data scrambled using the first scrambling seed to the additional word line when the additional word line is not in the list of word lines.

7. A storage device, comprising:
a memory including a plurality of memory cells coupled to a word line;
a controller configured to receive data from a host device, and to attempt to program the plurality of memory cells by applying the data scrambled using a first scrambling seed to the word line;
wherein the controller is further configured to receive other data from the host device, and, in response to the attempt to program the plurality of memory cells using the first scrambling seed failing, to attempt to program the plurality of memory cells after the plurality of memory cells are erased by applying the other data scrambled using a second scrambling seed different than the first scrambling seed to the word line.

8. The storage device of claim 7, wherein, in response to the attempt to program the plurality of memory cells using the first scrambling seed failing, the controller is further configured to attempt to program the plurality of memory cells by applying the data scrambled using the second scrambling seed to the word line before receiving the other data.

9. The storage device of claim 8, wherein in response to the attempt to program the plurality of memory cells using the second scrambling seed failing, the controller is further configured to add the word line to a list of word lines before receiving the other data.

10. The storage device of claim 9, wherein the memory includes additional memory cells coupled to an additional word line; and wherein the controller is further configured to attempt to program the additional memory cells by applying the data scrambled using the first scrambling seed to the additional word line after adding the word line to the list of word lines and before receiving the other data.

11. The storage device of claim 9, wherein the controller is further configured to determine whether the word line is in the list of word lines after receiving the other data, and to attempt to program the plurality of memory cells by applying the other data scrambled using the second scrambling seed to the word line when the word line is in the list of word lines.

12. The storage device of claim 11, wherein the memory comprises a block including the plurality of memory cells coupled to the word line; and wherein the controller is further configured to identify the block as a grown bad block (GBB) in response to the attempt to program the plurality of memory cells with the other data using the second scrambling seed failing.

13. The storage device of claim 9, wherein the memory includes additional memory cells coupled to an additional word line; and wherein the controller is further configured to determine whether the additional word line is in the list of word lines after receiving the other data, and to attempt to program the additional memory cells by applying the other data scrambled using the first scrambling seed to the additional word line when the additional word line is not in the list of word lines.

14. A storage device, comprising:
a memory comprising a block including a plurality of memory cells coupled to a word line;
a controller configured to attempt to program the plurality of memory cells by applying data scrambled using a first scrambling seed to the word line;
wherein the controller is further configured to receive other data from a host device, and in response to the attempt to program the plurality of memory cells using the first scrambling seed failing, to attempt to program the plurality of memory cells by applying the other data scrambled using a second scrambling seed different than the first scrambling seed to the word line; and wherein the controller is further configured to identify the block as a bad block in response to the attempt to program the plurality of memory cells with the other data using the second scrambling seed failing.

15. The storage device of claim 14, wherein, in response to the attempt to program the plurality of memory cells using the first scrambling seed failing, the controller is further configured to attempt to program the plurality of memory cells by applying the data scrambled using the second scrambling seed to the word line before identifying the block as the bad block.

16. The storage device of claim 15, wherein in response to the attempt to program the plurality of memory cells using the second scrambling seed failing, the controller is further configured to add the word line to a list of word lines before identifying the block as the bad block.

17. The storage device of claim 16, wherein the memory includes additional memory cells coupled to an additional word line; and wherein the controller is further configured to attempt to program the additional memory cells by applying the data scrambled using the first scrambling seed to the additional word line after adding the word line to the list of word lines and before identifying the block as the bad block.

18. The storage device of claim 16, wherein the controller is further configured to determine whether the word line is in the list of word lines before identifying the block as the bad block, and to attempt to program the plurality of memory cells by applying the other data scrambled using the second scrambling seed to the word line when the word line is in the list of word lines.

19. The storage device of claim 16, wherein the memory includes additional memory cells coupled to an additional word line; and wherein the controller is further configured to determine whether the additional word line is in the list of word lines before identifying the block as the bad block, and to attempt to program the additional memory cells by applying the other data scrambled using the first scrambling seed to the additional word line when the additional word line is not in the list of word lines.

* * * * *